United States Patent
Kim et al.

(10) Patent No.: US 11,551,729 B2
(45) Date of Patent: Jan. 10, 2023

(54) MEMORY DEVICE AND AN OPERATING METHOD THEREOF

(71) Applicant: SAMSUNG ELECTRONICS CO., LTD., Suwon-si (KR)

(72) Inventors: Sangyun Kim, Hwaseong-si (KR); Kyungryun Kim, Seoul (KR); Junghwan Park, Hwaseong-si (KR); Yeonkyu Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/215,914

(22) Filed: Mar. 29, 2021

(65) Prior Publication Data

US 2022/0068318 A1   Mar. 3, 2022

(30) Foreign Application Priority Data

Sep. 2, 2020   (KR) .......................... 10-2020-0111528

(51) Int. Cl.
| | |
|---|---|
| *G11C 11/34* | (2006.01) |
| *G11C 5/14* | (2006.01) |
| *G11C 7/22* | (2006.01) |
| *G11C 7/06* | (2006.01) |

(52) U.S. Cl.
CPC .............. *G11C 5/146* (2013.01); *G11C 7/065* (2013.01); *G11C 7/22* (2013.01)

(58) Field of Classification Search
CPC ........... G11C 5/146; G11C 7/065; G11C 7/22; G11C 7/1045; G11C 7/24; G11C 11/4074; G11C 11/4076; G11C 11/4078; G11C 11/4091; G11C 7/04
See application file for complete search history.

(56) References Cited

U.S. PATENT DOCUMENTS

| | | | |
|---|---|---|---|
| 5,822,264 A * | 10/1998 | Tomishima | ....... H01L 27/10897 365/230.03 |
| 6,744,301 B1 | 6/2004 | Tschanz et al. | |
| 6,967,522 B2 | 11/2005 | Chandrakasan et al. | |
| 7,120,804 B2 | 10/2006 | Tschanz et al. | |
| 7,183,596 B2 * | 2/2007 | Wu | ................. H01L 21/823857 257/E21.639 |
| 7,307,471 B2 | 12/2007 | Gammie et al. | |
| 8,698,516 B2 | 4/2014 | Rahim et al. | |
| 8,988,135 B2 | 3/2015 | Kim et al. | |
| 9,256,246 B1 | 2/2016 | Lim et al. | |
| 9,431,068 B2 | 8/2016 | Clark et al. | |
| 9,459,680 B2 | 10/2016 | Kim et al. | |
| 9,659,933 B2 | 5/2017 | Rana et al. | |
| 10,297,327 B2 | 5/2019 | Tran et al. | |

(Continued)

*Primary Examiner* — Huan Hoang
*Assistant Examiner* — Minh Dinh
(74) *Attorney, Agent, or Firm* — F. Chau & Associates, LLC

(57) ABSTRACT

A memory device includes: a first circuit; a second circuit; and an adaptive body bias generator configured to receive frequency detection information or temperature detection information, to apply a first forward body bias or a first reverse body bias to the first circuit in response to the frequency detection information or the temperature detection information, and to apply a second forward body bias or a second reverse body bias to the second circuit in response to the frequency detection information or the temperature detection information.

19 Claims, 14 Drawing Sheets

(56) References Cited

U.S. PATENT DOCUMENTS

| | | | |
|---|---|---|---|
| 2005/0264322 A1* | 12/2005 | Nakazato | G11C 7/065 327/51 |
| 2014/0032949 A1* | 1/2014 | Kim | G06F 1/324 713/322 |
| 2014/0159806 A1* | 6/2014 | Kim | G05F 3/205 327/537 |
| 2020/0313678 A1* | 10/2020 | Takai | G11C 7/222 |
| 2020/0357458 A1* | 11/2020 | Sung | G11C 11/4099 |

* cited by examiner

| Frequency | Speed Path | Leakage Path |
|---|---|---|
| High | FBB | RBB |
| Low | RBB | RBB |

FIG. 5A

| Temperature | Speed Path | Leakage Path |
|---|---|---|
| Cold | FBB | FBB |
| Hot | RBB | RBB |

FIG. 5B

| Mode | Frequency | Temperature | Core Circuit | Peripheral Circuit |
|------|-----------|-------------|--------------|--------------------|
| MD1 | High | Low | VBB_C_MD1 | VBB_P_MD1 |
| MD2 | High | High | VBB_C_MD2 | VBB_P_MD2 |
| MD3 | Low | Low | VBB_C_MD3 | VBB_P_MD3 |
| MD4 | Low | High | VBB_C_MD4 | VBB_P_MD4 |

MEMORY DEVICE AND AN OPERATING METHOD THEREOF

CROSS-REFERENCE TO RELATED APPLICATION(S)

This application claims priority under 35 U.S.C. § 119 to Korean Patent Application No. 10-2020-0111528 filed on Sep. 2, 2020 in the Korean Intellectual Property Office, the disclosure of which is incorporated by reference herein in its entirety.

TECHNICAL FIELD

The present inventive concept relates to a memory device and an operating method thereof.

DISCUSSION OF RELATED ART

In general, a body bias is used to dynamically adjust a threshold voltage of a transistor. A body bias can be used to tune a circuit's behavior to meet both power and performance specifications. For example, a forward body bias decreases the threshold voltage of a transistor, and a reverse body bias increases the threshold voltage of a transistor. In this case, the forward body bias is set to be lower than a normal body bias, and the reverse body bias is set to be higher than the normal body bias. A voltage difference between a source voltage and a body voltage affects the threshold voltage, and thus, a body may be considered as a second gate for turning a transistor on/off.

SUMMARY

Example embodiments provide a memory device for applying an adaptive body bias according to environmental information and an operating method thereof.

According to example embodiments of the inventive concept, a memory device includes: a first circuit; a second circuit; and an adaptive body bias generator configured to receive frequency detection information or temperature detection information, to apply a first forward body bias or a first reverse body bias to the first circuit in response to the frequency detection information or the temperature detection information, and to apply a second forward body bias or a second reverse body bias to the second circuit in response to the frequency detection information or the temperature detection information.

According to example embodiments of the inventive concept, an operating method of a memory device includes detecting at least one bias parameter, setting a body bias according to the at least one bias parameter; and applying the body bias to a circuit, wherein the setting of the body bias includes: setting a first forward body bias or a first reverse body bias as a first body bias for a speed path; and setting a second forward body bias or a second reverse body bias as a second body bias for a leakage path.

According to example embodiments of the inventive concept, a memory device includes: memory cells; and bit line sense amplifiers configured to sense data stored in the respective memory cells through bit lines and complementary bit lines connected to the respective memory cells, wherein a first bit line sense amplifier of the bit line sense amplifiers is driven with a forward body bias, or a second bit line sense amplifier of the bit line sense amplifiers is driven with a reverse body bias.

BRIEF DESCRIPTION OF DRAWINGS

The above and other features of the present inventive concept will be more clearly understood from the following detailed description, taken in conjunction with the accompanying drawings, in which:

FIG. 5A is a table illustrating body biases for a speed path area and a leakage path area based on frequency, and FIG. 5B is a table illustrating body biases for the speed path area and the leakage path area based on temperature;

DETAILED DESCRIPTION OF THE EMBODIMENTS

Hereinafter, example embodiments of the present disclosure will now be described in detail with reference to the accompanying drawings.

Figure 1:
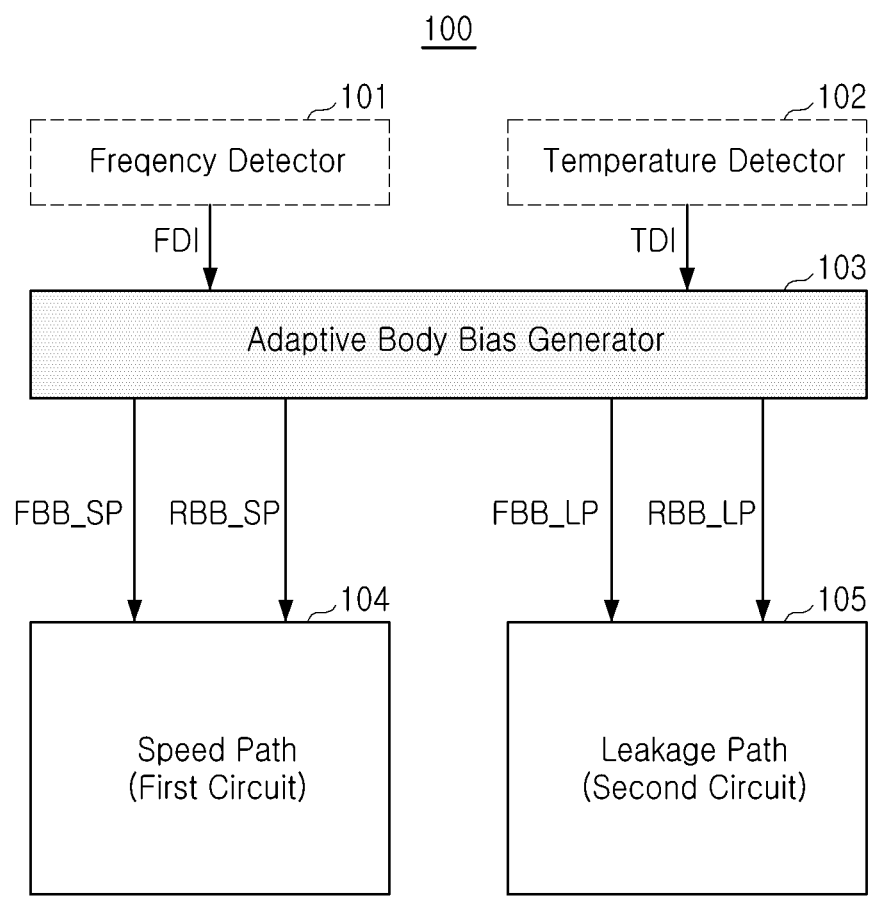
FIG. 1 is a diagram illustrating a memory device according to an example embodiment of the present disclosure.

FIG. 1 is a diagram illustrating a memory device 100 according to an example embodiment of the present disclosure. Referring to FIG. 1, the memory device 100 may include a frequency detector 101, a temperature detector 102, an adaptive body bias generator 103, a speed path 104, and a leakage path 105.

In the example embodiment, the memory device 100 may be implemented as a volatile memory. For example, the volatile memory may include at least one of a dynamic random access memory (DRAM), a synchronous DRAM (SDRAM), a double data rate SDRAM (DDR SDRAM), a low power double data rate SDRAM (LPDDR SDRAM), a graphics double data rate SDRAM (GDDR SDRAM), a rambus DRAM (RDRAM), and a static RAM (SRAM). In another example embodiment, the memory device 100 may be implemented as a non-volatile memory. For example, the non-volatile memory may include one of a NAND flash memory, a phase-change RAM (PRAM), a magneto-resistive RAM (MRAM), a resistive RAM (ReRAM), a ferroelectric RAM (FRAM), and a NOR flash memory.

The frequency detector 101 may determine whether a frequency of a clock received in the memory device 100 is higher than a reference frequency and output frequency detection information FDI. For example, the frequency detection information FDI may indicate that the received clock is higher than the reference frequency.

The temperature detector 102 may determine whether an internal temperature of the memory device 100 is higher than a reference temperature and output temperature detection information TDI. For example, the temperature detection information TDI may indicate that the internal temperature is higher than the reference temperature.

The adaptive body bias generator 103 may receive the frequency detection information FDI of the frequency detector 101 or the temperature detection information TDI of the temperature detector 102, generate bias voltages FBB_SP, RBB_SP, FBB_LP, and RBB_LP using the frequency detection information FDI or the temperature detection information TDI, and apply optimal bias voltages among the bias voltages FBB_SP, RBB_SP, FBB_LP, and RBB_LP to the speed path 104 or the leakage path 105.

In the example embodiment, the adaptive body bias generator 103 may apply one of a first forward body bias voltage FBB_SP and a first reverse body bias voltage RBB_SP to the speed path 104 using the frequency detection information FDI or the temperature detection information TDI. In this case, the first forward body bias voltage FBB_SP may be set to be lower than a normal body bias NBB, and the first reverse body bias voltage RBB_SP may be set to be higher than the normal body bias NBB.

For example, the adaptive body bias generator 103 may apply the first forward body bias voltage FBB_SP to the first circuit 104 in response to the frequency detection information FDI indicating that the frequency is higher than the reference frequency, and apply the first reverse body bias voltage RBB_SP to the first circuit 104 in response to the frequency detection information FDI indicating that the frequency is lower than the reference frequency.

For example, the adaptive body bias generator 103 may apply the first forward body bias voltage FBB_SP to the first circuit 104 in response to the temperature detection information TDI indicating that the temperature is lower than a reference temperature, and apply the first reverse body bias voltage RBB_SP to the first circuit 104 in response to the temperature detection information TDI indicating that the temperature is higher than the reference temperature.

In the example embodiment, the adaptive body bias generator 103 may apply one of a second forward body bias voltage FBB_LP and a second reverse body bias voltage RBB_LP to the leakage path 105 using the frequency detection information FDI or the temperature detection information TDI. In this case, the second forward body bias voltage FBB_LP may be set to be lower than the normal body bias NBB, and the second reverse body bias voltage RBB_LP may be set to be higher than the normal body bias NBB.

For example, the adaptive body bias generator 103 may apply the second forward body bias voltage FBB_LP to the second circuit 105 in response to the frequency detection information FDI indicating that the frequency is higher than the reference frequency, and apply the second reverse body bias voltage RBB_LP to the second circuit 105 in response to the frequency detection information FDI indicating that the frequency is lower than the reference frequency.

For example, the adaptive body bias generator 103 may apply the second forward body bias voltage FBB_LP to the second circuit 105 in response to the temperature detection information TDI indicating that the temperature is lower than the reference temperature, and apply the second reverse body bias voltage RBB_LP to the second circuit 105 in response to the temperature detection information TDI indicating that the temperature is higher than the reference temperature.

The speed path 104 may include a circuit that considers a speed in the memory device 100. For example, the speed path 104 may include a memory core circuit or a circuit associated with a data path.

The leakage path 105 may include a circuit that considers a leakage current in the memory device 100. For example, the leakage path 105 may include a circuit associated with setting an operation mode of the memory device 100.

Although the memory device 100 illustrated in FIG. 1 includes the frequency detector 101 and the temperature detector 102, the present disclosure is not limited thereto. A memory device according to the present disclosure may be implemented to receive frequency detection information or temperature detection information from an external device (e.g. a controller), without having a frequency detector and a temperature detector.

The memory device 100 according to the example embodiment of the present disclosure may provide optimal body biases to the speed path 104 and the leakage path 105 using the frequency detection information FDI or the temperature detection information TDI.

The speed path 104 and the leakage path 105 may be variously selected depending on the configuration of the memory device 100.

Hereinafter, the first forward body bias voltage FBB_SP, the first reverse body bias voltage RBB_SP, the second forward body bias voltage FBB_LP and the second reverse body bias voltage RBB_LP may be referred to altogether as bias voltages. In addition, FBB may be used to refer to a forward bias voltage and RBB may be used to refer to a reverse bias voltage.

Figure 2:
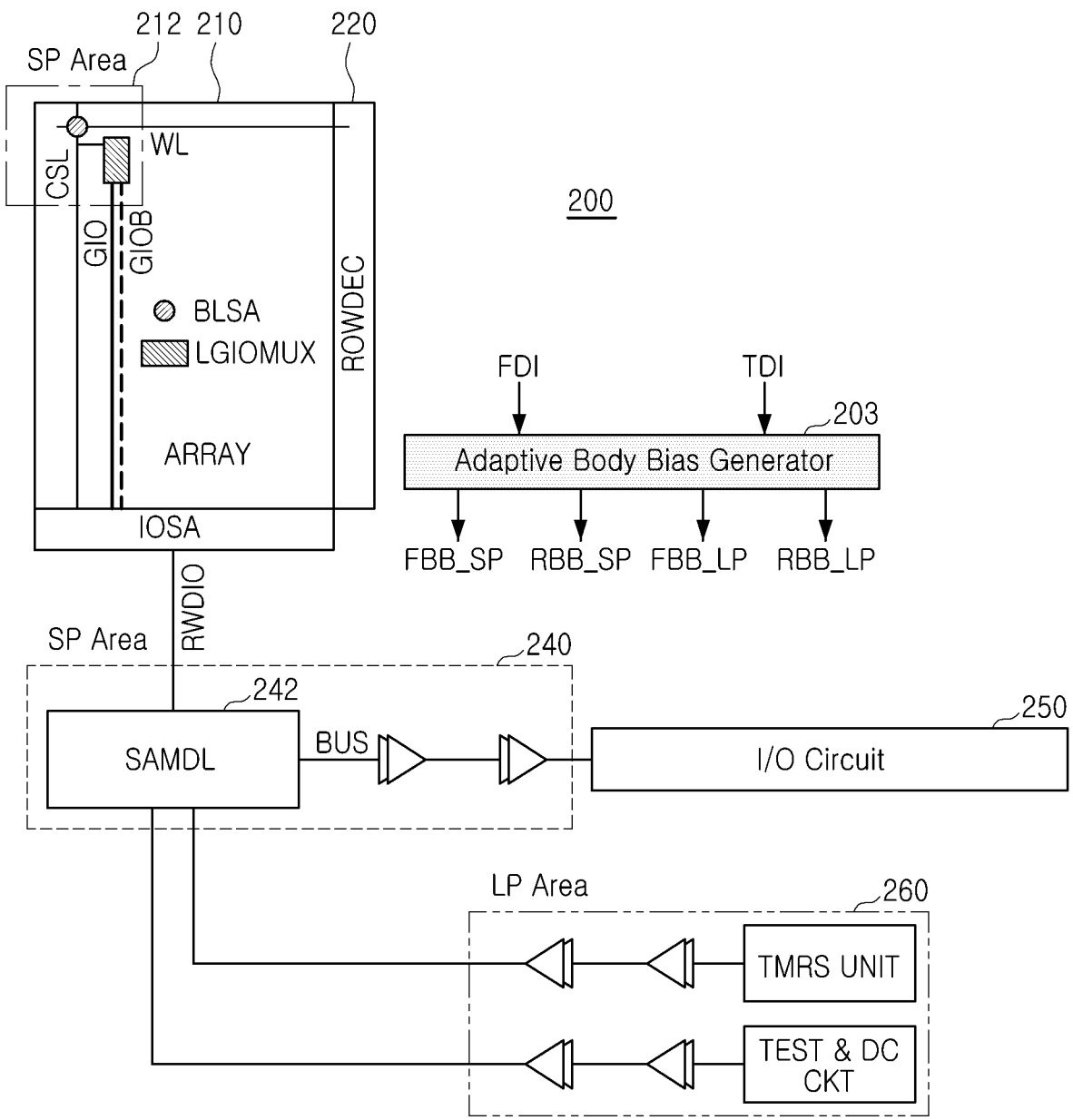
FIG. 2 is a diagram illustrating a memory device according to an example embodiment of the present disclosure.

FIG. 2 is a diagram illustrating a memory device 200 according to an example embodiment of the present disclosure. Referring to FIG. 2, the memory device 200 may include an adaptive body bias generator 203, a memory cell array 210, a row decoder ROWDEC 220, an input/output sense amplifier circuit IOSA 230, a data processing circuit 240, an input/output circuit 250, and a mode setting circuit 260.

The memory device 200 may include at least one transistor having a high-k metal gate (HKMG). A high-k material, which is an insulator material, generally has a high dielectric constant and a relatively large band gap, and thus has stability as compared with silicon. Components inside the memory device 200 may be divided into a speed path SP and a leakage path LIP. For example, the mode setting circuit 260 may be a leakage path LP (LP Area) and the data processing circuit 240 and portions of the memory cell array 210 may be a speed path SP (SP Area).

The adaptive body bias generator 203 may optimally provide the bias voltages FBB_SP, RBB_SP, FBB_LP, and RBB_LP to the speed path SP area and the leakage path LP area, using the frequency detection information FDI or the temperature detection information TDI.

In the example embodiment, the adaptive body bias generator 203 may apply an FBB to the speed path SP area and an RBB to the leakage path LP area at a frequency higher than a specific frequency.

In the example embodiment, the adaptive body bias generator 203 may apply RBBs to both the speed path SP area and the leakage path LP area at a frequency lower than the specific frequency.

In the example embodiment, the adaptive body bias generator 203 may apply an FBB to the speed path SP area and an RBB to the leakage path LP area at a low temperature.

In the example embodiment, the adaptive body bias generator 203 may apply RBBs to both the speed path SP area and the leakage path LP area at a high temperature. In the example embodiment, the speed path SP area and the leakage path LP area may receive adaptive body biases ABBs through different power control circuits.

In the example embodiment, the adaptive body bias generator 203 may generate a specific code corresponding to the frequency and the temperature to control the body biases of the speed path SP area and the leakage path LP area.

In the example embodiment, the adaptive body bias generator 203 may generate body bias levels of the speed path SP area and the leakage path LP area based on the specific code.

In the example embodiment, a core area 212 of the memory cell array 210 and the data processing circuit 240 may be set as the speed path SP area.

The data processing circuit 240 may include a sense amplifier module SAMDL 242 connected to the input/output sense amplifier circuit IOSA 230 through a data line RWDIO and buffers connected to a bus BUS. The input/output circuit 250 may receive data from the data processing circuit 240 and output the received data to an external device (e.g., a memory controller) or receive data from the external device and transmit the received data to the data processing circuit 240.

The mode setting circuit 260 may store an operation mode required for operating the memory device 200. The mode setting circuit 260 may include a test mode register set (TMRS) unit and a test and DC circuit. In addition, the mode setting circuit 260 may be set as the leakage path LP area, as illustrated in FIG. 2.

Figure 3A:
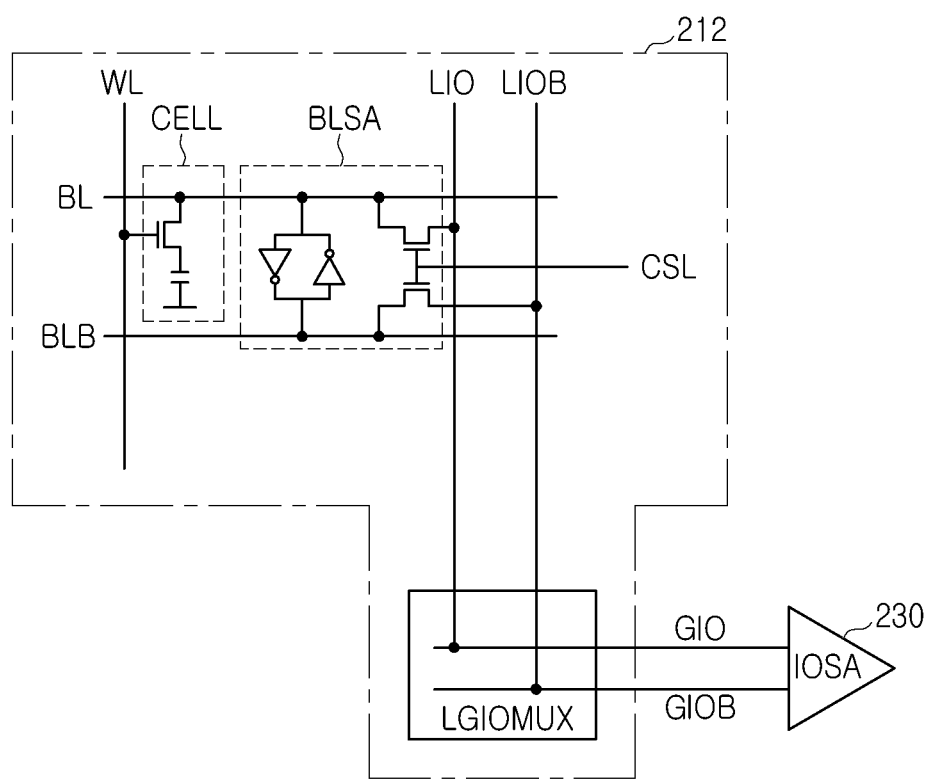
FIG. 3A is a diagram illustrating a core area in a speed path area illustrated in FIG. 2.

FIG. 3A is a diagram illustrating the core area 212 in the speed path SP area illustrated in FIG. 2. Referring to FIG. 3A, the core area 212 may include a memory cell (e.g., one transistor+one capacitor) connected to a word line WL and a bit line BL, a bit line sense amplifier BLSA, and a local line multiplexer LGIOMUX.

The bit line sense amplifier BLSA may sense a voltage difference between the bit line BL and a complementary bit line BLB in response to a voltage of a common source line CSL. Here, the memory cell may be connected between the bit line BL and the word line WL.

The bit line BL may be connected to a local input/output line LIO, and the complementary bit line BLB may be connected to a complementary local input/output line LIOB.

The input/output sense amplifier circuit IOSA 230 may sense a voltage difference between the global input/output line GIO and the complementary global input/output line GIOB.

The bit line sense amplifier BLSA and the local line multiplexer LGIOMUX according to the example embodiment of the present disclosure may be set as the speed path SP area.

The speed path area SP according to the present disclosure may include a circuit implemented with a transistor having a high-k metal gate (HKMG).

Figure 3B:
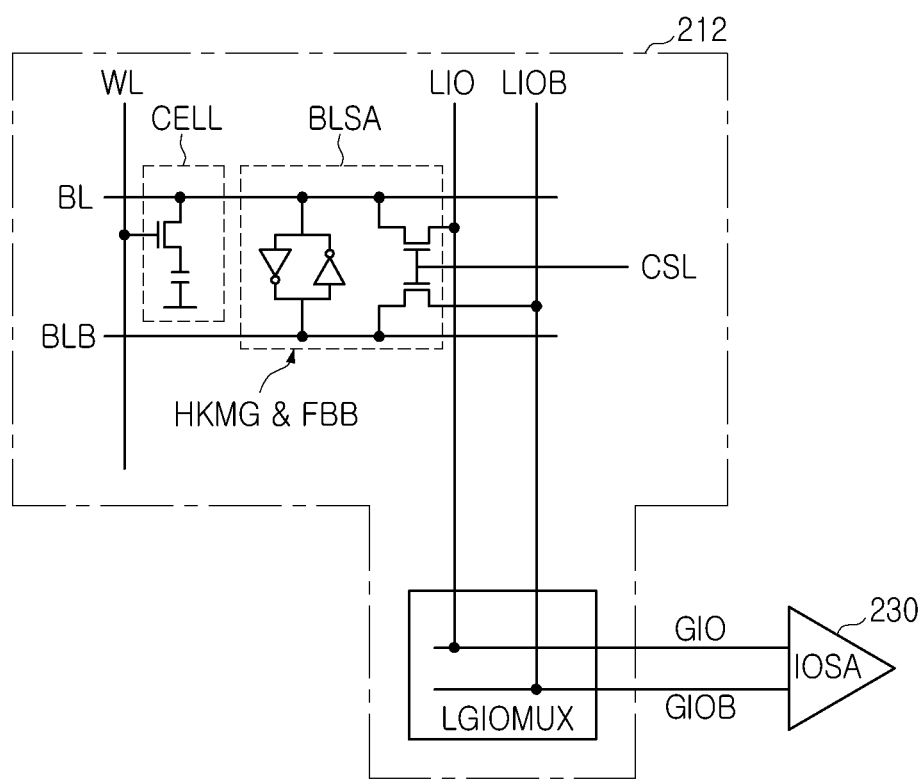
FIG. 3B is a diagram illustrating a circuit implemented with a transistor having a high-k metal gate (HKMG) in the speed path area illustrated in FIG. 2.
Figure 4:
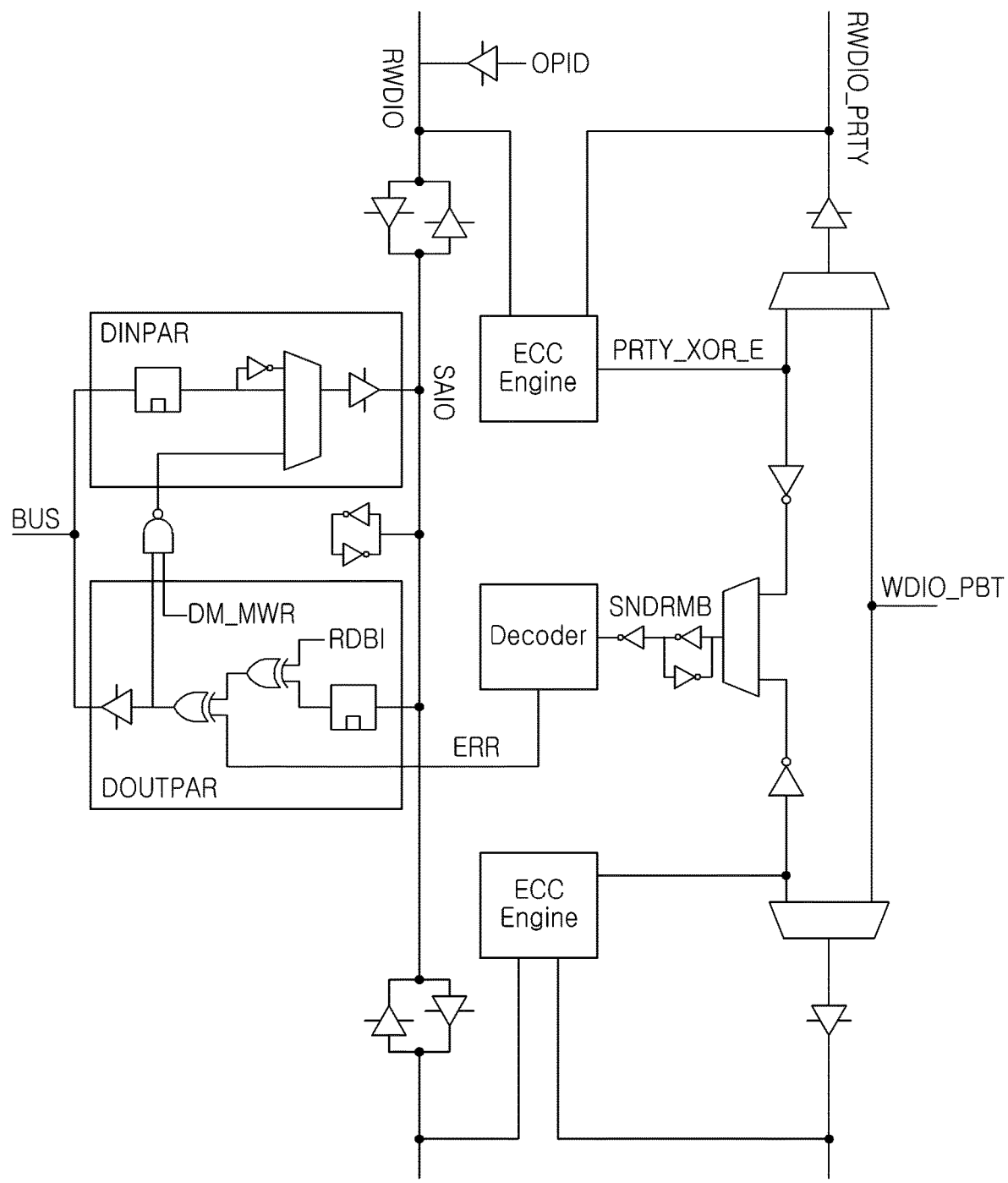
FIG. 4 is a diagram illustrating a data processing circuit in the speed path area illustrated in FIG. 2.

FIG. 3B is a diagram illustrating a circuit implemented with a transistor having a HKMG in the speed path area illustrated in FIG. 2. Referring to FIG. 3B, the bit line sense amplifier BLSA in the core area 212 may be implemented with at least one transistor having a HKMG. In the example embodiment, an FBB may be applied to the bit line sense amplifier BLSA in a specific condition. In another example embodiment, an RBB may be applied to the bit line sense amplifier BLSA in a specific condition. FIG. 4 is a diagram illustrating the data processing circuit 240 in the speed path SP area illustrated in FIG. 2. Referring to FIG. 4, the data processing circuit 240 may include error correction code (ECC) engines performing data error corrections, a decoder generating errors ERRs through a syndrome SNDRMB, and a write-data skew correction circuit DINPAR connected to a sense line SAIO, and a read-data skew correction circuit DOUTPAR connected to the sense line SAIO. Here, the skew write-date and read-data correction circuits DINPAR and DOUTPAR may be activated by control signals DM_MWR and RDBI.

Each of the ECC engines may perform an error correction operation by receiving data and corresponding parity from the data line RWDIO and a parity line RWDIO_PRTY, respectively, and outputting a parity error value PRTY_X-OR_E. In the example embodiment, activation of the parity line RWDIO_RRTY may be determined in response to a write-data test signal WDIO_PBT. The data line RWDIO is precharged by the signal OPID.

The data processing circuit 240 according to the example embodiment of the present disclosure may be set as the speed path SP area.

FIG. 5A is a table illustrating body biases for the speed path area and the leakage path area based on frequency. Referring to FIG. 5A, when the frequency is higher (High) than the reference frequency, a forward body bias FBB may be applied to the speed path and a reverse body bias RBB may be applied to the leakage path. When the frequency is lower (Low) than the reference frequency, reverse body biases RBBs may be applied to both the speed path and the leakage path.

It should be understood that the frequency-related bias setting for the speed path and the leakage path illustrated in FIG. 5A is merely an example.

FIG. 5B is a table illustrating body biases for the speed path area and the leakage path area based on temperature. Referring to FIG. 5B, when the temperature is lower (Cold) than the reference temperature, forward body biases FBBs may be applied to both the speed path and the leakage path.

On the other hand, when the temperature is higher than the reference temperature (Hot), reverse body biases RBB may be applied to both the speed path and the leakage path.

It should be understood that the temperature-related bias setting for the speed path and the leakage path illustrated in FIG. 5B is merely an example.

According to the present disclosure, a plurality of bias voltages corresponding to a plurality of modes may be generated.

Figures 6, 7:
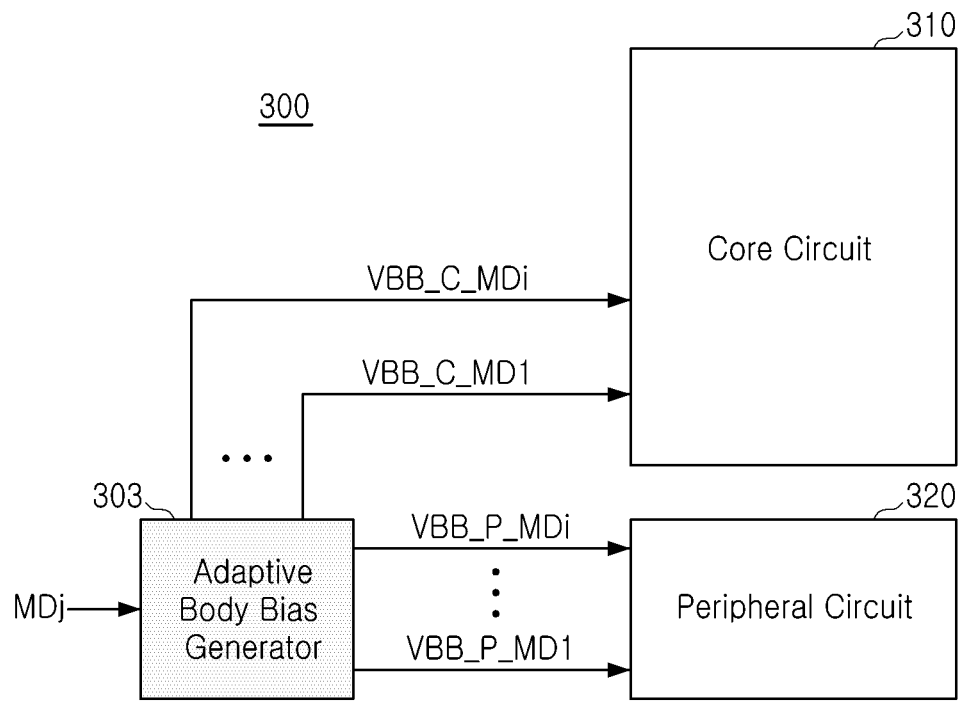
FIG. 6 is a diagram illustrating a memory device according to another example embodiment of the present disclosure.
FIG. 7 is a diagram illustrating bias voltages for a core circuit and a peripheral circuit in each mode according to an example embodiment of the present disclosure.

FIG. 6 is a diagram illustrating a memory device 300 according to another example embodiment of the present disclosure. Referring to FIG. 6, the memory device 300 may include a bias circuit 303, a core circuit 310, and a peripheral circuit 320.

The bias circuit 303 may be an adaptive body bias generator and generate first bias voltages VBB_C_MD1 to VBB_C_MDi for the core circuit 310 and second bias voltages VBB_P_MD1 to VBB_P_MDi for the peripheral circuit 320 in response to mode information MDj (6 is an integer greater than or equal to 2).

As illustrated in FIG. 6, according to received mode information MDj (j is a positive integer), the bias circuit 303 may generate a first bias voltage VBB_C_MDi (i is an integer greater than or equal to j) for the core circuit 310 and a second bias voltage VBB_P_MDi for the peripheral circuit 320, apply the first bias voltage VBB_C_MDi to the core circuit 310, and apply the second bias voltage VBB_P_MDi to the peripheral circuit 320.

FIG. 7 is a diagram illustrating bias voltages for the core circuit and the peripheral circuit in each mode according to the example embodiment of the present disclosure. Referring to FIG. 7, the bias voltages for the core circuit 310 and the peripheral circuit 320 in each mode are illustrated based on frequency and temperature.

A first mode MD1 is an operation mode when the frequency is higher (High) than the reference frequency and the temperature is lower (Low) than the reference temperature. In this case, a first bias voltage VBB_C_MD1 may be applied to the core circuit 310 and a second bias voltage VBB_P_MD1 may be applied to the peripheral circuit 320.

A second mode MD2 is an operation mode when the frequency is higher (High) than the reference frequency and the temperature is higher (High) than the reference temperature. In this case, a first bias voltage VBB_C_MD2 may be applied to the core circuit 310 and a second bias voltage VBB_P_MD2 may be applied to the peripheral circuit 320.

A third mode MD3 is an operation mode when the frequency is lower (Low) than the reference frequency and the temperature is lower (Low) than the reference temperature. In this case, a first bias voltage VBB_C_MD3 may be applied to the core circuit 310 and a second bias voltage VBB_P_MD3 may be applied to the peripheral circuit 320.

A fourth mode MD4 is an operation mode when the frequency is lower (Low) than the reference frequency and the temperature is higher (High) than the reference temperature. In this case, a first bias voltage VBB_C_MD4 may be applied to the core circuit 310 and a second bias voltage VBB_P_MD4 may be applied to the peripheral circuit 320.

In FIGS. 1 to 7, different body biases are applied to the speed path area and the leakage path area, respectively. However, the present disclosure is not limited thereto. According to the present disclosure, different body biases may be applied to the same area for processing reasons.

FIGS. 8A to 8F are diagrams illustrating that a bias condition of a sense amplifier is differently set, reflecting a mismatch in a process.

Figure 8A:
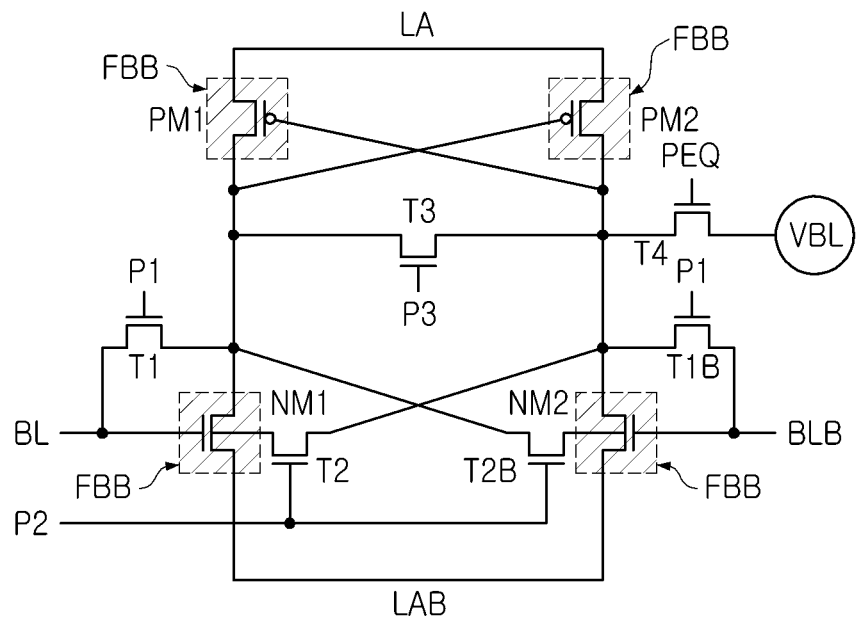
FIGS. 8A, 8B, 8C. 8D, 8E and 8F are diagrams illustrating that a bias condition of a sense amplifier is differently set, reflecting a mismatch in a process.

In a sense amplifier illustrated in FIG. 8A, pull-up transistors PM1 and PM2 and pull-down transistors NM1 and NM2 are relatively low in driving capability as compared with normal transistors T1, T1B, T2, T2B, T3, and T4. Here, pull-up transistors PM1 and PM2 are connected to the local input/output line LA, pull-down transistors NM1 and NM2 are connected to the complementary local input/output line LAB. Here, control signals P1, P2, P3, and PEQ corresponding to the normal transistors T1, T1B, T2, T2B, T3, and T4 may be provided. In this case, a forward body bias FBB may be applied to each of the pull-up/pull-down transistors PM1, PM2, NM1, and NM2 in the sense amplifier.

Figure 8B:
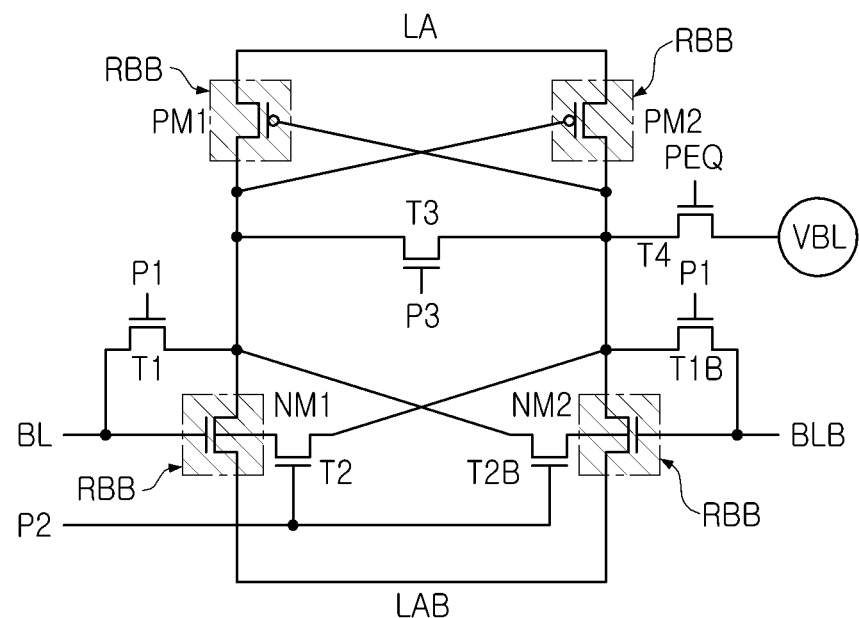

In a sense amplifier illustrated in FIG. 8B, pull-up transistors PM1 and PM2 and pull-down transistors NM1 and NM2 are relatively high in driving capability as compared with normal transistors T1, T1B, T2, T2B, T3, and T4. In this case, a reverse body bias RBB may be applied to each of the pull-up/pull-down transistors PM1, PM2, NM1, and NM2 in the sense amplifier.

Figure 8C:
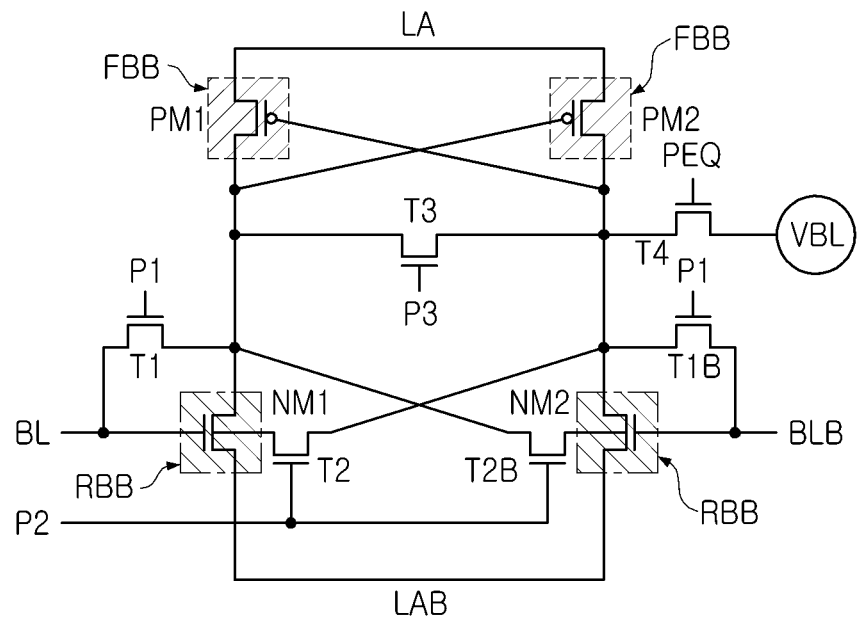

In a sense amplifier illustrated in FIG. 8C, pull-up transistors PM1 and PM2 are lower in driving capability than normal transistors T1, T1B, T2, T2B, T3, and T4, and pull-down transistors NM1 and NM2 are higher in driving capability than the normal transistors T1. T1B, T2, T2B, T3, and T4. In this case, a forward body bias FBB may be applied to each of the pull-up transistors PM1 and PM2 and a reverse body bias RBB may be applied to each of the pull-down transistors NM1 and NM2 in the sense amplifier.

Figure 8D:
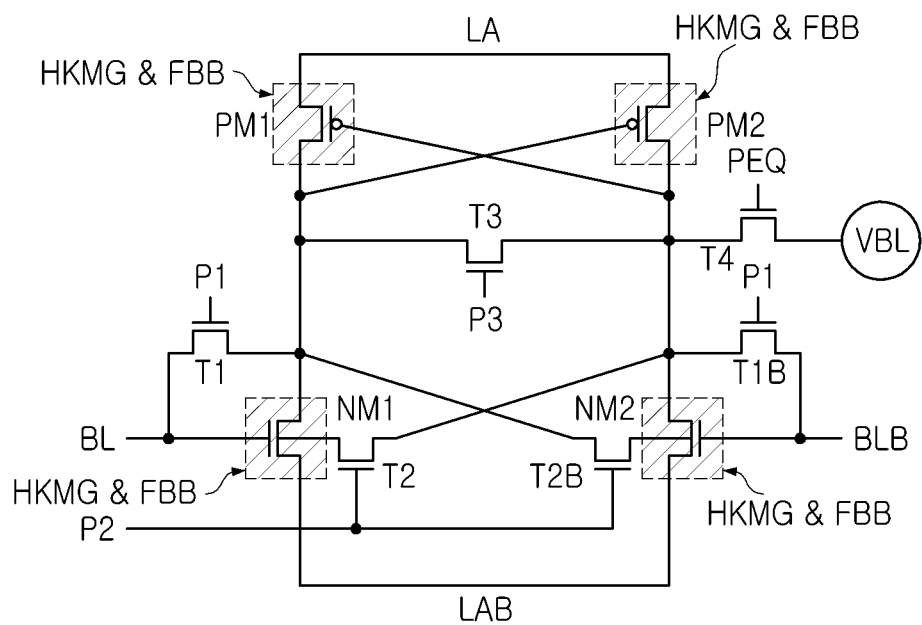
Figure 8E:
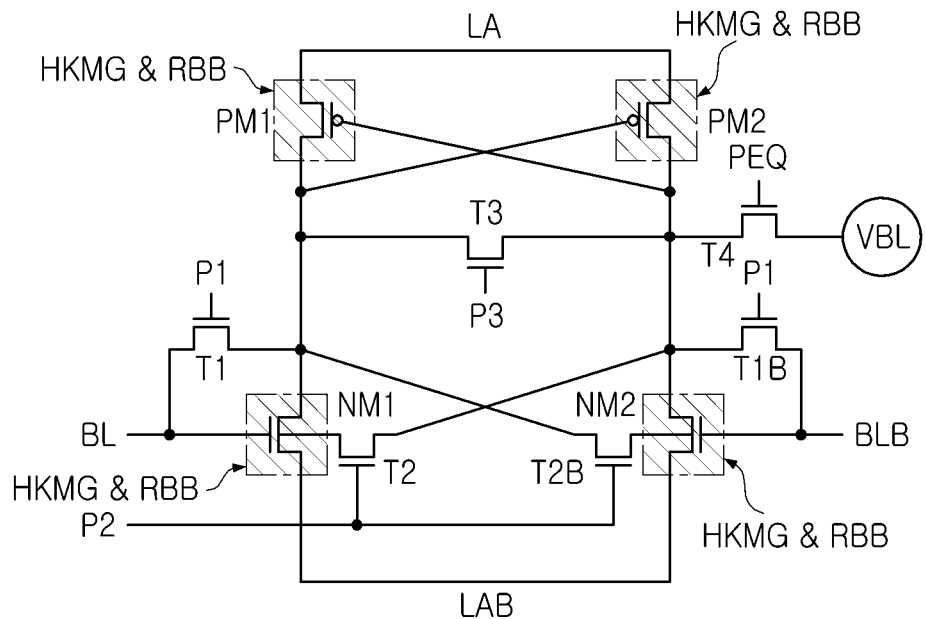
Figure 8F:
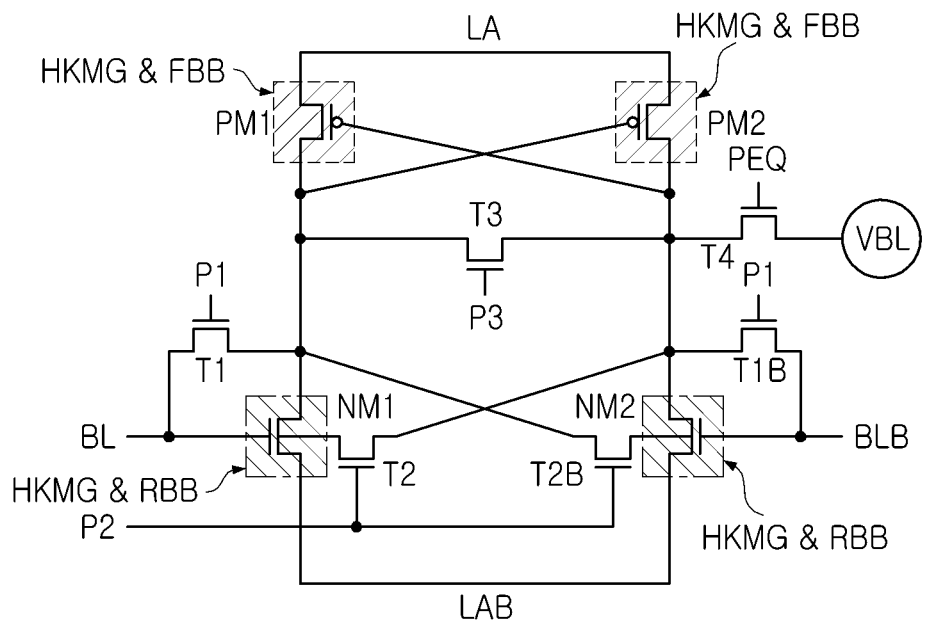

In a memory chip provided with HKMGs, the HKMGs may be provided in only some transistors (e.g., the pull-up/pull-down transistors PM1, PM2, NM1, and NM2) among the transistors of the bit line sense amplifier BLSA. As illustrated in FIGS. 8D, 8E, and 8F, each of the pull-up/pull-down transistors PM1, PM2, NM1, and NM2 may be a transistor that is implemented with a HKMG, and each of the other transistors, e.g., the normal transistors T1, T1B, T2, T2B, T3, and T4, may be a transistor that is not implemented with a HKMG.

In the sense amplifier illustrated in FIG. 8D, the pull-up transistors PM1 and PM2 and the pull-down transistors NM1 and NM2 may be implemented with HK MGs and receive forward body biases FBBs.

In the sense amplifier illustrated in FIG. 8E, the pull-up transistors PM1 and PM2 and the pull-down transistors NM1 and NM2 may be implemented with HKMGs and receive reverse body biases RBBs.

In the sense amplifier illustrated in FIG. 8F, the pull-up transistors PM1 and PM2 and the pull-down transistors NM1 and NM2 may be implemented with HKMGs. Each of the pull-up transistors PM1 and PM2 may receive a forward body bias FBB, and each of the pull-down transistors NM1 and NM2 may receive a reverse body bias RBB.

In particular, open/close (OC) characteristics can be optimized by applying an adaptive body bias ABB to a transistor of the bit line sense amplifier BLSA provided with a HKMG. In the example embodiment, when an OC speed is slow, an FBB may be applied to increase the OC speed, and when the OC speed is fast, an RBB may be applied to adjust OC distribution. In the example embodiment, the common mode can be adaptively set by combining body biases of an n-type metal oxide semiconductor (NMOS) transistor amplifier (NSA) and a p-type metal oxide semiconductor (PMOS) transistor amplifier (PSA).

In the memory chip provided with HKMGs, a body voltage VBB configuring an array may be set to be different for each bank based on the number of times of access.

Figure 9:
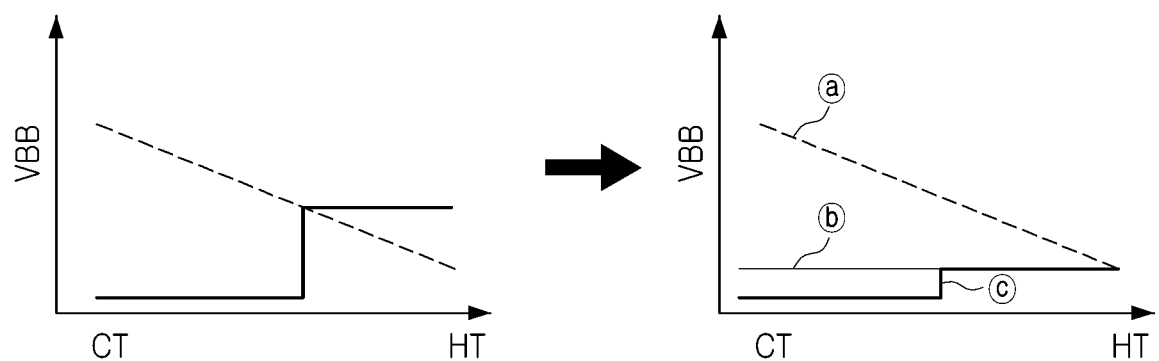
FIG. 9 is a diagram illustrating that an adaptive bias is set to compensate for a row hammer according to an example embodiment of the present disclosure.

FIG. 9 is a diagram illustrating that an adaptive bias is set to compensate for a row hammer (R/H) according to the example embodiment of the present disclosure. Referring to FIG. 9, the body bias voltage VBB is set to be lower at a high temperature I-IT than at a low temperature CT. However, cells subject to row hammer attacks (in other words, cells connected to a frequently-accessed word line WL) may have worse tRCD/tRDL than those that are not subject to row hammer attacks. In this case, if the body bias voltage VBB is applied deeply, a potential barrier may be higher and the R/H characteristics may be improved. ⓐ, ⓑ, and ⓒ illustrated in FIG. 9 indicate that the body bias is controlled differently for each bank based on the number of times of access.

Figure 10:
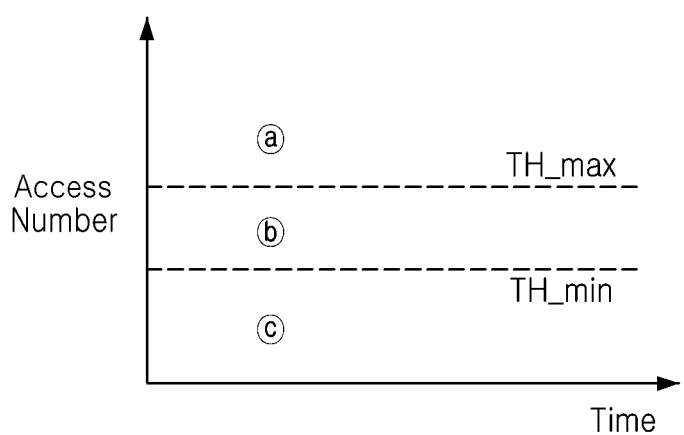
FIG. 10 is a diagram illustrating that a bias condition is set differently based on the number of times of access according to an example embodiment of the present disclosure.
Figure 11:
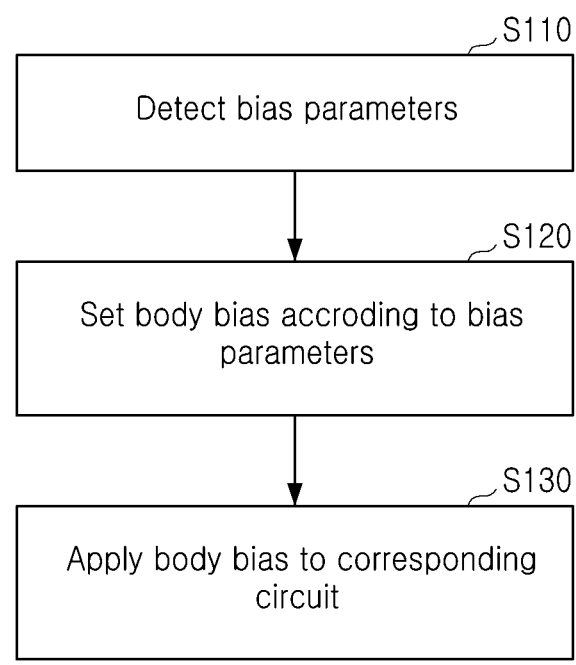
FIG. 11 is a flowchart illustrating a bias applying method of a memory device according to an example embodiment of the present disclosure.

FIG. 10 is a diagram illustrating that a bias condition is set differently based on the number of times of access according to the example embodiment of the present disclosure. Referring to FIG. 10, when the number of times of access is smaller than a minimum threshold value TH_mim, body bias control corresponding to ⓒ may be performed. When the number of times of access is between the minimum threshold value TH_mim and a maximum threshold value TH_max, body bias control corresponding to ⓑ may be performed. When the number of times of access is greater than the maximum threshold value TH_max, body bias control corresponding to ⓐ may be performed. ⓐ, ⓑ, and ⓒ illustrated in FIG. 10 correspond to those illustrated in FIG. 9, FIG. 11 is a flowchart illustrating a bias applying method of a memory device according to an example embodiment of the present disclosure. Referring to FIG. 11, the bias applying method of the memory device according to the example embodiment of the present disclosure may proceed as follows.

Bias parameters required for setting a body bias may be detected (S110). For example, the bias parameters may be an operating frequency, an operating temperature, and the like.

Subsequently, the body bias may be set using the bias parameters (S120). In the example embodiment, the body bias may be set differently based on predetermined areas. In the example embodiment, the predetermined areas may include a speed path area and a leakage path area. In another example embodiment, the predetermined areas may include a core area and a peripheral area. Thereafter, the set body bias may be applied to a corresponding circuit (S130).

In the example embodiment, the setting of the body bias (S120) may include setting one of a first forward body bias and a first reverse body bias as a first body bias for the speed path, and setting one of a second forward body bias and a second reverse body bias as a second body bias for the leakage path.

In the example embodiment, at least one bias parameter may include a frequency of a clock received or a temperature of the memory device. In the example embodiment, the speed path may include a bit line sense amplifier of a memory cell array and a sense amplifier circuit. In the example embodiment, the leakage path may include a mode setting circuit. In the example embodiment, bias mode information for setting the body biases may be received from an external device. The body bias may be set using the bias mode information and the at least one bias parameter.

Figure 12:
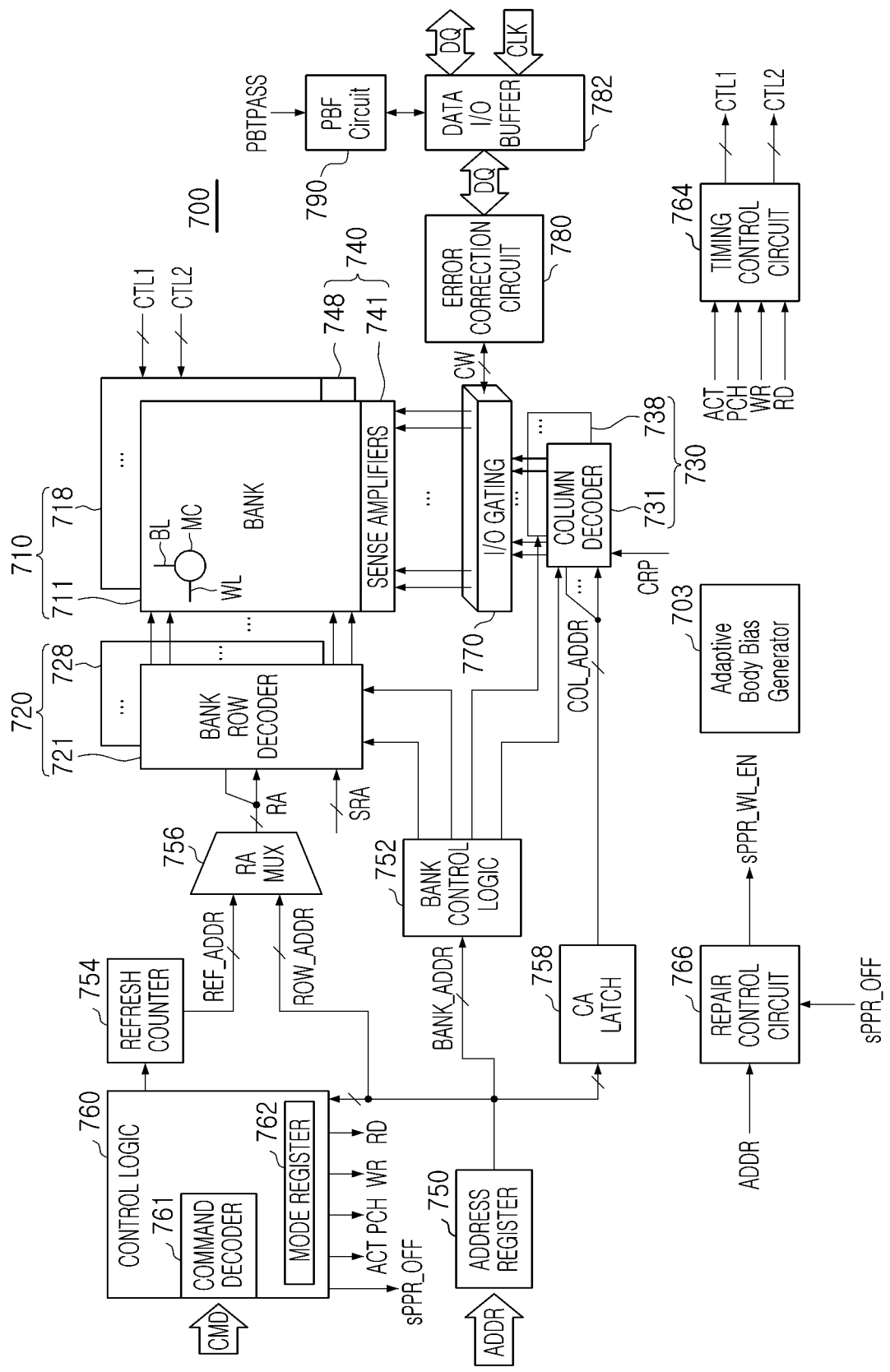
FIG. 12 is a diagram illustrating a memory device according to an example embodiment of the present disclosure.

FIG. 12 is a diagram illustrating a memory device 700 according to an example embodiment of the present disclosure. Referring to FIG. 12, the memory device 700 may include an adaptive body bias generator 703, a memory cell array 710, a row decoder 720, a column decoder 730, a sense amplifier circuit 740, an address register 750, a bank control logic 752, a refresh counter 754, a row address multiplexer 756, a column address latch 758, a control logic 760, a repair control circuit 766, a timing control circuit 764, an input/output gating circuit 770, an error correction circuit 780, a data input/output buffer 782, and a parallel bit test (PBT) circuit 790.

The adaptive body bias generator 703 may apply optimum values of bias voltages to the memory device 700 according to environmental information, as illustrated in FIGS. 1 to 11.

The memory cell array 710 may include first to eighth banks 711 to 718. It should be understood that the number of banks in the memory cell array 710 is not limited thereto. For example, the memory cell array 710 may include more or fewer than eight banks.

The row decoder 720 may include first to eighth bank row decoders 721 to 728 connected to the first to eighth banks 711 to 718, respectively.

The column decoder 730 may include first to eighth bank column decoders 731 to 738 connected to the first to eighth banks 711 to 718, respectively.

The sense amplifier circuit 740 may include first to eighth bank sense amplifiers 741 to 748 connected to the first to eighth banks 711 to 718, respectively.

The first to eighth banks 711 to 718, the first to eighth bank row decoders 721 to 728, the first to eighth bank column decoders 731 to 738, and the first to eighth bank sense amplifiers 741 to 748 may configure the first to eighth banks, respectively. Each of the first to eighth banks 711 to 718 may include a plurality of memory cells MC formed at points at which word lines WL and bit lines BL intersect each other.

The address register 750 may receive and store an address ADDR having a bank address BANK_ADDR, a row address ROW_ADDR, and a column address COL_ADDR from an external memory controller. The address register 750 may provide the received bank address BANK_ADDR to the bank control logic 752, provide the received row address ROW_ADDR to the row address multiplexer 756, and provide the received column address COL_ADDR to the column address latch 758.

The bank control logic 752 may generate bank control signals in response to the bank address BANK_ADDR. In response to the bank control signals, a bank row decoder corresponding to the bank address BANK_ADDR among the first to eighth bank row decoders 721 to 728 may be activated. In response to the bank control signals, a bank column decoder corresponding to the bank address BANK_ADDR among the first to eighth bank column decoders 731 to 738 may be activated.

The row address multiplexer 756 may receive the row address ROW_ADDR from the address register 750 and receive a refresh row address REF_ADDR from the refresh counter 754. The row address multiplexer 756 may selectively output the row address ROW_ADDR or the refresh row address REF_ADDR as a row address RA. The row address RA output from the row address multiplexer 756 may be applied to each of the first to eighth bank row decoders 721 to 728.

Among the first to eighth bank row decoders 721 to 728, a bank row decoder activated by the bank control logic 752 may decode the row address RA output from the row address multiplexer 756 to activate a word line corresponding to the row address. For example, the activated bank row decoder may apply a word line driving voltage to the word line corresponding to the row address. In addition, the activated bank row decoder may activate a redundancy word line corresponding to a redundancy row address output from the repair control circuit 766, simultaneously with the activating of the word line corresponding to the row address.

The column address latch 758 may receive the column address COL_ADDR from the address register 750 and temporarily store the received column address COL_ADDR. In addition, the column address latch 758 may gradually increase the received column address COL_ADDR in a burst mode. The column address latch 758 may apply the temporarily-stored or gradually-increased column address COL_ADDR to each of the first to eighth bank column decoders 731 to 738.

Among the first to eighth bank column decoders 731 to 738, a bank column decoder activated by the bank control logic 752 may activate a sense amplifier corresponding to the bank address BANK_ADDR and the column address COL_ADDR through the input/output gating circuit 770. In addition, the activated bank column decoder may perform a column repair operation in response to a column repair signal CRP output from the repair control circuit 766.

The control logic 760 may control an operation of the memory device 700. For example, the control logic 760 may generate control signals for the memory device 700 to perform a write operation or a read operation. The control logic 760 may include a command decoder 761 for decoding a command CMD received from the memory controller and a mode register 762 for setting an operation mode of the memory device 700.

For example, the command decoder 761 may decode a write enable signal (/WE), a row address strobe signal (/RAS), a column address strobe signal (/CAS), a chip select signal (/CS), etc. to generate operational control signals ACT, PCH, WR, and RD corresponding to the command CMD. The control logic 760 may provide the operational control signals ACT, PCH, WR, and RD to the timing control circuit 764. The control signals ACT, PCH, WR, and RD may include an active signal ACT, a precharge signal PCH, a write signal WR, and a read signal RD. In response to the operational control signals ACT, PCH, WR, and RD, the timing control circuit 764 may generate first control signals CTL1 for controlling voltage levels of the word lines WL and second control signals CTL2 for controlling voltage levels of the bit lines BL, and provide the first control signals CTL1 and the second control signals CTL2 to the memory cell array 710.

The repair control circuit 766 may generate repair control signals CRP and SRP for controlling repair operations of a first cell area and a second cell area for at least one of the banks, based on the row address ROW_ADDR and the column address COL_ADDR of the address ADDR (or access address) and fuse information for each of the word lines. The repair control circuit 766 may provide the redundancy row address to a corresponding bank row decoder, provide the column repair signal CRP to a corresponding bank column decoder, and provide the select signal and the enable signal SRA to a block control circuit related to a corresponding redundancy array block.

In addition, in a hard post package repair (hPPR) mode stored in the mode register 762, the repair control circuit 766 may generate an hPPR word line activation signal in response to the address ADDR. In a soft post package repair (sPPR) mode stored in the mode register 762, the repair control circuit 766 may generate an sPPR word line activation signal sPPR_WL_EN in response to the address ADDR. Furthermore, in an sPPR_OFF mode stored in the mode register 762, the repair control circuit 766 may turn off an sPPR logic and generate a normal word line activation signal to access previous data. In the example embodiment, the repair control circuit 766 may change a repair unit based on the address ADDR and the fuse information. For example, the repair control circuit 766 may change the type and the number of repair address bits based on the address ADDR and the fuse information.

In the input/output gating circuit 770, each of the input/output gating circuits may include input data mask logic, read data latches for storing data output from the first to eighth banks 711 to 718, and write drivers for writing data to the first to eighth banks 711 to 718, together with circuits for gating input/output data.

A codeword CW to be read by one of the first to eighth banks 711 to 718 may be sensed by a sense amplifier corresponding to the one bank and stored in the read data latches. The codeword CW stored in the read data latches may be provided to the memory controller through the data input/output buffer 782 after ECC decoding is performed by the error correction circuit 780. Data DQ to be written to one of the first to eighth banks 711 to 718 may be written to the one bank through the write drivers after ECC encoding is performed by the error correction circuit 780.

The data input/output buffer 782 may provide data DQ to the error correction circuit 780 in a write operation based on a clock signal CLK provided from the memory controller, and provide data DQ from the error correction circuit 780 to the memory controller in a read operation.

The error correction circuit 780 may generate parity bits based on data bits of the data DQ provided from the data input/output buffer 782 in the write operation and provide a codeword CW including the data DQ and the parity bits to the input/output gating circuit 770, and the input/output gating circuit 770 may write the codeword to the bank.

In addition, the error correction circuit 780 may receive the codeword CW read by one bank from the input/output gating circuit 770 in the read operation. The error correction circuit 780 may perform ECC decoding with respect to the data DQ using the parity bits included in the read codeword CW to correct at least one error bit included in the data DQ and provide the corrected data DQ to the data input/output buffer 782.

The PBT circuit 790 may perform a parallel test operation on each of the banks with test data received from a tester, perform a repair operation when an error correction is possible, and output a result value according to the result.

In addition, the PBT circuit 790 may pass a corresponding bank in response to a test pass signal PBTPASS regardless of the result value of the test operation on the bank. In the example embodiment, the test pass signal PBTPASS may be output from the mode register set 762 during the parallel bit test operation.

Even if the memory device 700 includes a bank that cannot be repaired using the repair control circuit 766, an output terminal of such a bank may be processed with masking in response to the test pass signal PBTPASS.

Figure 13:
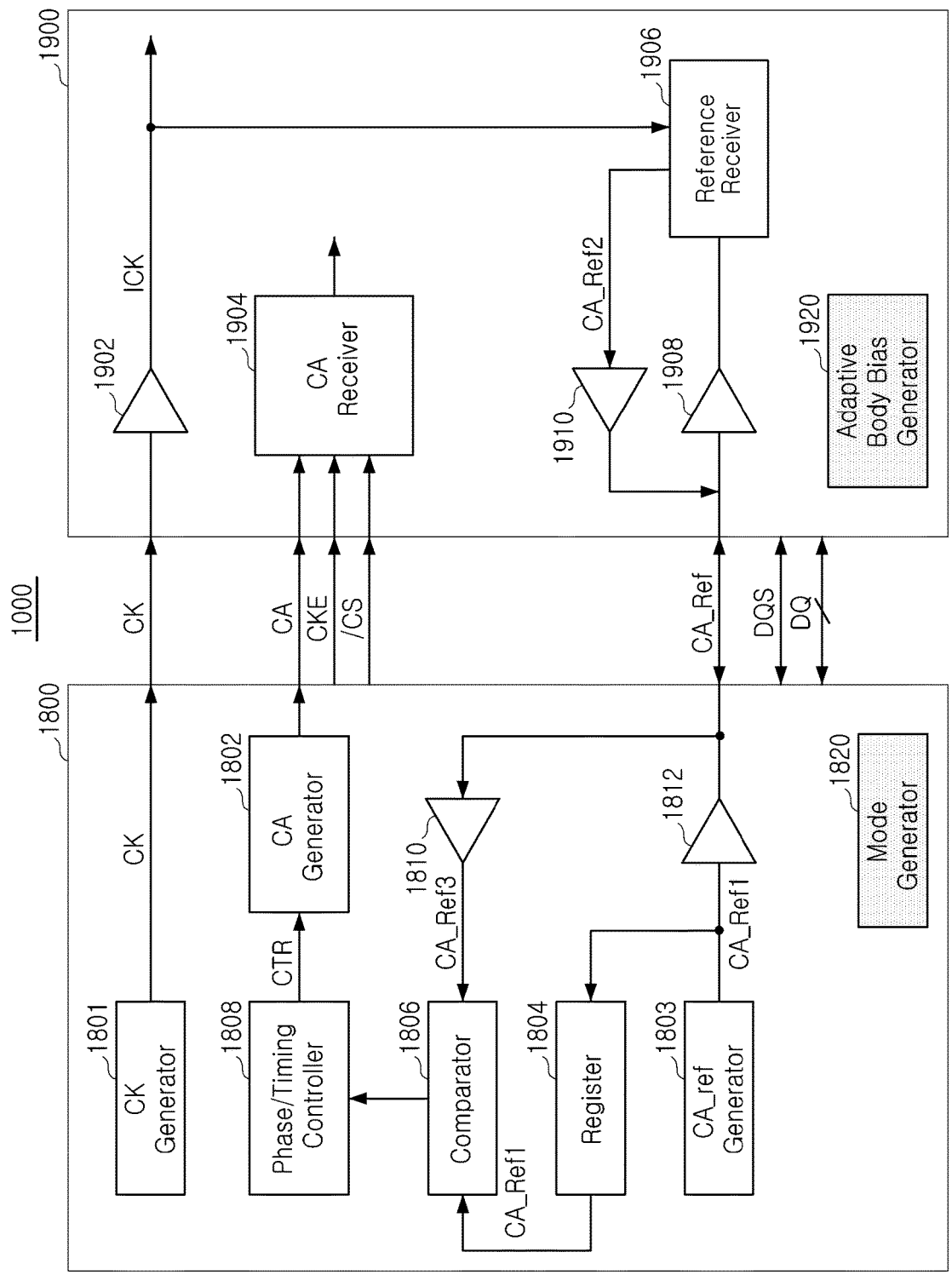
FIG. 13 is a diagram illustrating a memory system performing at least one command/address calibration according to an example embodiment of the present disclosure.

FIG. 13 is a diagram illustrating a memory system performing at least one command/address calibration according to an example embodiment of the present disclosure.

Referring to FIG. 13, a memory system 1000 may include a controller 1800 and a memory device 1900. The controller 1800 may include a clock generator 1801, a command/address (CA) generator 1802, a command/address reference generator 1803, a register 1804, a comparator 1806, a phase/timing controller 1808, and data input/output units 1810 and 1812. The controller 1800 may provide a clock signal CK generated by the clock generator 1801 to the memory device 1900 through a clock signal line.

In the example embodiment, the memory system 1000 may include a line for a command/address reference signal CA_Ref separately in an interface. The line for the command/address reference signal CA_Ref may act to transmit and receive the command/address reference signal CA_Ref, which is a reference value of the command/address, in a calibration mode.

A result value of calibration using the reference value of the command/address may be provided to the phase/timing controller 1808 to adjust a phase/timing of the command/address signal CA. The separate line for the command/address reference signal CA_Ref is useful in that the calibration operation for adjusting the phase/timing of the command/address signal CA can be performed simultaneously with the operation for transmitting the command/address signal CA.

The CA generator 1802 may generate a command/address signal CA whose phase or timing is adjusted in response to a control signal CTR of the phase/timing controller 1808 and transmit the command/address signal CA to the memory device 1900 through a CA bus.

The command/address reference generator 1803 may be configured in the same manner as the command/address generator 1802, and generate a first command/address reference signal CA_Ref1 that is the same as the command/address signal CA generated from the command/address generator 1802.

The first command/address reference signal CA_Ref1 may be provided to the register 1804. In addition, the first command/address reference signal CA_Ref1 may be transmitted to a CA reference bus (CA_Ref) through the data output unit 1812 and provided to the memory device 1900 through the CA reference bus (CA_Ref).

The register 1804 may store the first command/address reference signal CA_Ref1. The comparator 1806 may compare the first command/address reference signal CA_Ref1 stored in the register 1804 with a third command/address reference signal CA_Ref3 output from the data input unit 1810. The comparator 1806 may generate a pass or fail signal P/F by comparing data between the first command/address reference signal CA_Ref1 and the third command/address reference signal CA_Ref3.

The phase/timing controller 1808 may generate a control signal CTR indicating a phase shift of the command/address signal CA according to the pass or fail signal P/F of the comparator 1806. Based on the control signal CTR, a phase or timing of the command/address signal CA may be adjusted to generate a phase-adjusted command/address signal CA.

The data input unit 1810 may receive a second command/address reference signal CA_Ref transmitted through the CA reference bus (CA_Ref) from the memory device 1900 and transmit the received second command/address reference signal CA_Ref2 to the comparator 1806 as the third command/address reference signal CA_Ref3.

The data output unit 1812 may receive the first command/address reference signal CA_Ref1 generated from the command/address reference generator 1803 and transmit the received first command/address reference signal CA_Ref1 to the CA reference bus (CA_Ref).

The memory device 1900 may include a clock buffer 1902, a command/address (CA) receiver 1904, a command/address reference receiver 1906, and data input/output units 1908 and 1910. The clock buffer 1902 may generate an internal clock signal ICK by receiving the clock signal CK transmitted through the clock signal line. In response to the internal clock signal ICK, the CA receiver 1904 may receive a chip select signal/CS, a clock enable signal CKE, and a command/address signal CA transmitted through the CA bus.

The clock enable signal CKE may be used as a pseudo command acting as a read command of the command/address signal CA transmitted through the CA bus. The CA receiver 1904 may receive the command/address signal CA when the clock enable signal CKE is activated.

The data input unit 1908 may receive the first command/address reference signal CA_Ref1 transmitted through the CA reference bus (CA_Ref) from the controller 1800 and transmit the received first command/address reference signal CA_Ref1 to the command/address reference receiver 1906. The command/address reference receiver 1906 may be configured in the same manner as the CA receiver 1904. The command/address reference receiver 1906 may generate a second command/address reference signal CA_Ref2 by receiving the chip select signal/CS, the clock enable signal CKE, and the first command/address reference signal CA_Ref1 transmitted through the CA reference bus (CA_Ref) in response to the internal clock signal ICK.

The second command/address reference signal CA_Ref2 may be the same as the signal output from the CA receiver 1904 by receiving the chip select signal /CS, the clock enable signal CKE, and the command/address reference signal CA transmitted through the CA bus in response to the internal clock signal ICK. The second command/address reference signal CA_Ref2 may be transmitted to the CA reference bus (CA_Ref) through the data output unit 1910.

CA calibration performed in the memory system 1000 will now be described. The CA generator 1802 of the controller 1800 may adjust a phase or timing of a command/address signal CA in response to a control signal CTR of the phase/timing controller 1808 and transmit the command/address signal CA to the CA bus. The command/address reference generator 1803 may generate a first command/address reference signal CA_Ref1 that is the same as the command/address signal CA and transmit the first command/address reference signal CA_Ref1 to the CA reference bus (CA_Ref).

The CA reference receiver 1906 of the memory device 1900 may generate a second command/address reference signal CA_Ref2 by receiving the first command/address reference signal CA_Ref1 in response to an internal clock signal ICK and a clock enable signal CKE. The second command/address reference signal CA_Ref2 of the memory device 1900 may be transmitted through the CA reference bus (CA_Ref).

The controller 1800 may transmit the second command/address reference signal CA_Ref2 transmitted through the CA reference bus (CA_Ref) to the comparator 1806 as a third command/address reference signal CA_Ref3. The comparator 1806 may compare data between the first command/address reference signal CA_Ref1 and the third command/address reference signal CA_Ref3 to generate a pass or fail signal P/F. The phase/timing controller 1808 may generate a control signal CTR indicating a phase shift of the command/address signal CA according to the pass or fail signal P/F of the comparator 1806. The CA generator 1802 may generate a phase-adjusted command/address signal CA according to the control signal CTR.

By repeating the above-described CA calibration operation, the phase/timing controller 1808 of the controller 1800 may determine the middle of pass (P) positions as the middle of a command/address signal CA window, generate a command/address signal CA so that the middle of the command/address signal CA window corresponds to edges of a clock signal CK, and provide the generated command/address signal CA to the memory device 1900. Accordingly, the memory device 1900 may receive the command/address signal CA for which the middle of an effective window corresponds to rising and falling edges of the clock signal CK, for example, rising and falling edges of a pair of clock signals CK and CKB.

The memory device 1900 included in the memory system 1000 according to the example embodiment of the present disclosure may control a body bias mode.

The controller 1800 may include a mode generator 1820 for generating a body bias mode based on environmental information (e.g., frequency information and temperature information) of the memory device 1900.

The memory device 1900 may include an adaptive body bias generator 1920 for receiving body bias mode information and providing optimal body bias voltages to predetermined areas during operation.

The memory chip to which high-k metal gates HKMGs are applied according to the example embodiment of the present disclosure may be divided into a speed path and a leakage path for each block, and a body bias may be adjusted differently for each path based on a combination of temperature and frequency (e.g., read latency). In the example embodiment, a forward body bias FBB may be applied to the speed path and a reverse body bias RBB may be applied to the leakage path to improve a margin at a frequency higher than a specific frequency (or at a low temperature), and RBBs may be applied to both the speed path and leakage path at a frequency lower than the specific frequency (or at a high temperature), thereby optimizing power consumption.

In the bit line sense amplifier BLSA of the memory chip provided with HKMGs according to the example embodiment of the present disclosure, the HKMG may be provided to a transistor that considers a threshold voltage mismatch, and PSiON may be applied to a transistor that considers reliability (e.g., P2 in FIGS. 8A, 8B, and 8C), thereby optimizing core characteristics.

In the example embodiment, OC characteristics can be optimized by adjusting the body biases of the bit line sense amplifier. As a result, OC speed distribution can be controlled, and D0/D1 balancing can be achieved.

The memory chip provided with HKMGs may be divided into a speed path and a leakage path for each block, and may include a circuit for generating a specific code in conjunction with frequency and temperature and a circuit for generating a different body bias for each path according to the code value to control the bias.

In an example embodiment, in the bit line sense amplifier BLSA of the memory chip provided with HKMGs, the HKMGs may be provided only in some of the transistors constituting the bit line sense amplifier BLSA.

In the example embodiment, the speed distribution as the OC characteristics can be minimized by applying adaptive body biases ABBs to the transistors of the bit line sense amplifier provided with the HKMGs.

In the example embodiment, the common mode can be adjusted by adjusting body directions of the NSA and the PSA in the bit line sense amplifier BLSA, thereby achieving the D0/D1 balancing.

In the example embodiment, the body bias may be adaptively set for each bank based on the number of times of access.

In the memory device according to the example embodiment of the present disclosure and the operating method thereof, optimal body biases can be applied to corresponding circuits based on frequency detection information or temperature detection information.

While example embodiments of the present disclosure have been illustrated and described above, it will be apparent to those skilled in the art that modifications and variations could be made thereto without departing from the scope of the present inventive concept as set forth in the appended claims.

What is claimed is:

1. A memory device, comprising:
   a first circuit;
   a second circuit;
   a frequency detector configured to detect a frequency of a clock received from an external device and generate frequency detection information; and
   an adaptive body bias generator configured to receive the frequency detection information or temperature detection information, to apply a first forward body bias or a first reverse body bias to the first circuit in response to the frequency detection information or the temperature detection information, and to apply a second forward body bias or a second reverse body bias to the second circuit in response to the frequency detection information or the temperature detection information,
   wherein the first circuit is part of a speed path, and the second circuit is part of a leakage path,
   wherein the adaptive body bias generator applies the first forward body bias to the first circuit in response to the frequency detection information indicating that the frequency is higher than a reference frequency, and
   wherein the adaptive body bias generator applies the first reverse body bias to the first circuit in response to the frequency detection information indicating that the frequency is lower than the reference frequency.

2. The memory device of claim 1, wherein the adaptive body bias generator applies the second forward body bias to the second circuit in response to the frequency detection information indicating that the frequency is higher than the reference frequency, and
   applies the second reverse body bias to the second circuit in response to the frequency detection information indicating that the frequency is lower than the reference frequency.

3. The memory device of claim 1, further comprising a temperature detector configured to detect a temperature of the memory device and generate the temperature detection information.

4. The memory device of claim 3, wherein the adaptive body bias generator applies the first forward body bias to the first circuit in response to the temperature detection information indicating that the temperature is lower than a reference temperature, and
   applies the first reverse body bias to the first circuit in response to the temperature detection information indicating that the temperature is higher than the reference temperature.

5. The memory device of claim 4, wherein the adaptive body bias generator applies the second forward body bias to the second circuit in response to the temperature detection information indicating that the temperature is lower than the reference temperature, and
   applies the second reverse body bias to the second circuit in response to the temperature detection information indicating that the temperature is higher than the reference temperature.

6. The memory device of claim 1, wherein the first circuit includes a core circuit,
   the second circuit includes a peripheral circuit, and
   at least one of the core circuit and the peripheral circuit includes at least one transistor having a high-k metal gate (HKMG).

7. The memory device of claim 1, wherein the frequency detection information or the temperature detection information is received from the external device.

8. The memory device of claim 1, wherein the speed path is included in a data processing circuit, a bit line sense amplifier, a logical line multiplexer, a memory core circuit, a circuit related to a data path, or a circuit implemented with a transistor having a high-k metal gate (HKMG).

9. An operating method of a memory device, the method comprising:
   detecting at least one bias parameter;
   setting a body bias according to the at least one bias parameter; and
   applying the body bias to a circuit, wherein the setting of the body bias includes:
setting a first forward body bias or a first reverse body bias as a first body bias for a speed path; and
setting a second forward body bias or a second reverse body bias as a second body bias for a leakage path.

10. The method of claim 9, Wherein the at least one bias parameter includes a frequency of a clock or a temperature of the memory device.

11. The method of claim 9, wherein the speed path includes a bit line sense amplifier of a memory cell array and a sense amplifier circuit, and
the bit line sense amplifier includes at least one transistor having a high-k metal gate (HKMG).

12. The method of claim 9, wherein the leakage path includes a mode setting circuit, and
the mode setting circuit includes at least one transistor having a high-k metal gate (HKMG).

13. The method of claim 9, further comprising receiving bias mode information for setting the body bias from an external device.

14. A memory device, comprising:
memory cells; and
bit line sense amplifiers configured to sense data stored in the respective memory cells through bit lines and complementary bit lines connected to the respective memory cells,
wherein a first bit line sense amplifier of the bit line sense amplifiers is driven with a forward body bias, or a second bit line sense amplifier of the bit line sense amplifiers is driven with a reverse body bias,
wherein a bit line sense amplifier of the bit line sense amplifiers includes at least one first transistor to which the forward body bias is applied and at east one second transistor to which the reverse body bias is applied.

15. The memory device of claim 14, wherein the forward and reverse body biases are differently set, based on a number of times each of the memory cells is accessed, for a corresponding one of the bit line sense amplifiers.

16. The memory device of claim 14, wherein the forward and reverse body biases are differently set, based on a data value stored in each of the memory cells, for a corresponding one of the bit line sense amplifiers.

17. The memory device of claim 14, wherein frequency detection information or temperature detection information is received from an external device, and the forward and reverse body biases are differently set, based on the received frequency detection information or temperature detection information.

18. The memory device of claim 14, wherein at least one of the bit line sense amplifiers includes at least one pull-up or pull-down transistor having a high-k metal gate (HKMG).

19. The memory device of claim 18, wherein the forward body bias or the reverse body bias is applied to the at least one pull-up or mill-down transistor.

* * * * *